United States Patent
Xu et al.

(10) Patent No.: US 7,927,958 B1
(45) Date of Patent: Apr. 19, 2011

(54) SYSTEM AND METHOD FOR PROVIDING A SELF ALIGNED BIPOLAR TRANSISTOR USING A SILICON NITRIDE RING

(75) Inventors: Mingwei Xu, South Portland, ME (US); Steven J. Adler, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 559 days.

(21) Appl. No.: 11/803,515

(22) Filed: May 15, 2007

(51) Int. Cl.
*H01L 21/00* (2006.01)

(52) U.S. Cl. .................. 438/321; 438/312; 438/434

(58) Field of Classification Search .......... 438/321, 438/312, 343
See application file for complete search history.

(56) References Cited

U.S. PATENT DOCUMENTS

| | | | |
|---|---|---|---|
| 5,866,462 A | 2/1999 | Tsai et al. | |
| 6,020,246 A * | 2/2000 | Koscielniak et al. | 438/341 |
| 6,043,554 A | 3/2000 | Miwa | |
| 6,130,136 A | 10/2000 | Johnson et al. | |
| 6,329,698 B1 * | 12/2001 | Koscielniak et al. | 257/565 |
| 6,492,238 B1 * | 12/2002 | Ahlgren et al. | 438/322 |
| 6,559,020 B1 | 5/2003 | Salmi | |
| 6,667,521 B2 * | 12/2003 | Ahlgren et al. | 257/370 |
| 6,740,552 B2 | 5/2004 | Gonzalez et al. | |
| 6,767,798 B2 * | 7/2004 | Kalnitsky et al. | 438/341 |
| 6,780,695 B1 | 8/2004 | Chen et al. | |
| 6,809,024 B1 * | 10/2004 | Dunn et al. | 438/623 |
| 6,864,560 B2 * | 3/2005 | Khater et al. | 257/565 |
| 6,906,401 B2 * | 6/2005 | Dunn et al. | 257/623 |
| 6,940,149 B1 * | 9/2005 | Divakaruni et al. | 257/565 |
| 6,960,820 B2 * | 11/2005 | Freeman et al. | 257/586 |
| 6,972,443 B2 * | 12/2005 | Khater | 257/197 |
| 7,002,221 B2 * | 2/2006 | Khater et al. | 257/360 |
| 7,018,778 B1 | 3/2006 | Leibiger et al. | |
| 7,026,666 B2 * | 4/2006 | Kalnitsky et al. | 257/190 |
| 7,037,798 B2 * | 5/2006 | Adam et al. | 438/312 |
| 7,087,940 B2 * | 8/2006 | Khater et al. | 257/197 |
| 7,119,416 B1 * | 10/2006 | Adam et al. | 257/592 |
| 7,253,096 B2 * | 8/2007 | Khater et al. | 438/623 |
| 7,341,920 B2 * | 3/2008 | Khater | 438/364 |
| 7,494,887 B1 | 2/2009 | Hussain | |
| 7,566,626 B1 * | 7/2009 | Xu et al. | 438/343 |
| 7,611,954 B2 * | 11/2009 | Freeman et al. | 438/321 |

(Continued)

OTHER PUBLICATIONS

P. Chevalier, et al., "230 Ghz self-aligned SiGeC HBT for 90 nm BiCMOS technology", 2004 IEEE, p. 225-228.
S. Harrison, et al., "Poly-gate Replacement Through Contact Hole (Pretch): A new method for High-K/Metal gate and multi-oxide implementation on chip," IEEE 2004, pp. 12.2.1-12.2.4.
D. Nguyen-Ngoc et al., "A 200 mm SiGe-HBT BiCMOS Technology for Mixed Signal Applications," 1995 IEEE, BCTM95 Process Technology, pp. 89-92.
Yousuke Yamamoto et al., "SDX: A Novel Self-Aligned Technique and Its Application to High-Speed Bipolar LSI's," IEEE Transactions on Electron Devices, vol. 35, No. 10, Oct. 1988, pp. 1601-1608.
Bengt Edholm et al., "A Self-Aligned Lateral Bipolar Transistor Realized on SIMOX-Material," IEEE Transactions on Electron Devices, vol. 40, No. 12, Dec. 1993, pp. 2359-2360.

(Continued)

*Primary Examiner* — Laura M Menz

(57) ABSTRACT

A system and method are disclosed for providing a self aligned bipolar transistor using a silicon nitride ring. An active region of the transistor is formed and a sacrificial emitter is formed above the active region of the transistor. A silicon nitride ring is formed around the sacrificial emitter. The sacrificial emitter and the silicon nitride ring are formed by depositing a layer of silicon nitride material over the active area of the transistor and performing an etch process to simultaneously create both the sacrificial emitter and the silicon nitride ring. The silicon nitride ring provides support for forming a raised external base for the transistor.

21 Claims, 7 Drawing Sheets

U.S. PATENT DOCUMENTS

| | | | |
|---|---|---|---|
| 7,642,168 B1 * | 1/2010 | Xu et al. | 438/364 |
| 7,687,887 B1 * | 3/2010 | El-Diwany et al. | 257/565 |
| 7,709,930 B2 * | 5/2010 | Stricker et al. | 257/565 |
| 7,781,295 B1 * | 8/2010 | Ramdani et al. | 438/312 |
| 7,838,375 B1 * | 11/2010 | Xu et al. | 438/321 |
| 2001/0017399 A1 | 8/2001 | Oda et al. | |
| 2003/0045066 A1 | 3/2003 | Igarashi | |
| 2004/0188797 A1 * | 9/2004 | Khater et al. | 257/510 |
| 2005/0142787 A1 | 6/2005 | Ko | |
| 2005/0184359 A1 | 8/2005 | Akatsu et al. | |
| 2006/0054595 A1 | 3/2006 | Starzynski | |
| 2006/0249814 A1 | 11/2006 | Greenberg et al. | |
| 2007/0001264 A1 | 1/2007 | Sheridan et al. | |
| 2007/0215978 A1 * | 9/2007 | Stricker et al. | 257/565 |
| 2010/0127352 A1 * | 5/2010 | El-Diwany et al. | 257/586 |

OTHER PUBLICATIONS

Michihiro Inoue et al., "Self-Aligned Complementary Bipolar Transistors Fabricated with a Selective-Oxidation Mask," IEEE Transactions on Electron Devices, vol. ED-34, No. 10, Oct. 1987, pp. 2146-2152.

D. L. Harame et al., "Si/SiGe Epitaxial-Base Transistors-Part II: Process Integration and Analog Applications," IEEE Transactions on Electron Devices, vol. 42, No. 3, Mar. 1995, pp. 469-482.

* cited by examiner

SYSTEM AND METHOD FOR PROVIDING A SELF ALIGNED BIPOLAR TRANSISTOR USING A SILICON NITRIDE RING

TECHNICAL FIELD OF THE INVENTION

The system and method of the present invention is generally directed to the manufacture of integrated circuits and, in particular, to a system and method for providing a self aligned bipolar transistor using a silicon nitride ring.

BACKGROUND OF THE INVENTION

Self aligned architectures in bipolar transistors are advantageous is that they provide better window downscaling and lower levels of parasitic capacitances and parasitic resistances. One commonly used prior art method of manufacturing self aligned bipolar transistors involves the use of a sacrificial nitride emitter and a raised external base.

Complex process steps are often required to form a self aligned bipolar transistor that has a sacrificial nitride emitter and a raised external base. Such complex process steps include selective epitaxial (EPI) growth and chemical mechanical polishing (CMP) procedures. These complex process steps increase the cost and processing time required to manufacture this type of self aligned bipolar transistors.

Therefore, there is a need in the art for a system and method that is capable of solving the problems that occur when such prior art methods are utilized. In particular, there is a need in the art for a system and method for providing an improved process for manufacturing a self aligned bipolar transistor that has a sacrificial nitride emitter and a raised external base without using complex process steps.

The method of the present invention solves the problems that are associated with the prior art by providing a supporting silicon nitride ring. An active region of a transistor is formed and a sacrificial emitter is formed above the active region of the transistor. The silicon nitride ring of the invention is formed around the sacrificial emitter. The sacrificial emitter and the silicon nitride ring are formed by depositing a layer of silicon nitride material over the active area of the transistor and performing an etch process to simultaneously create both the sacrificial emitter and the silicon nitride ring. The silicon nitride ring provides support for forming a raised external base for the transistor. The sacrificial emitter and the silicon nitride ring are then subsequently etched away and an emitter window is formed for the transistor. A polysilicon emitter structure is then formed in the emitter window.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
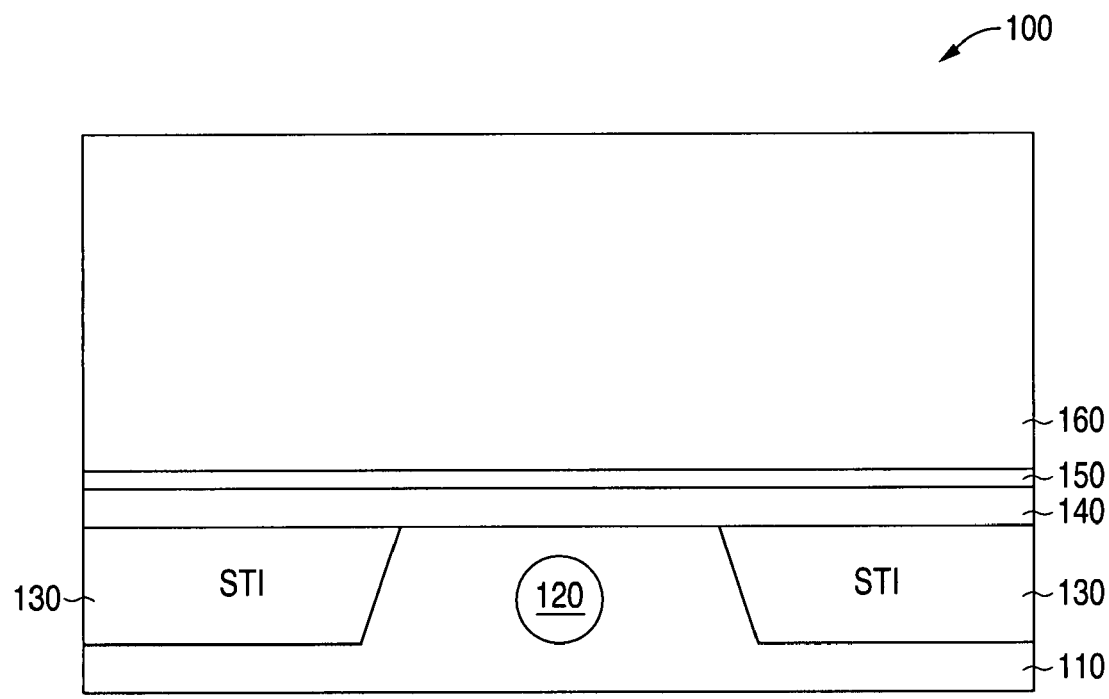
FIG. 1 illustrates a schematic diagram of a cross section of a structure formed during the manufacture of a self aligned bipolar transistor using a sacrificial nitride emitter and a silicon nitride ring of the present invention.

FIGS. 1 through 17, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

FIGS. 1 through 16 illustrate successive steps in the formation of an advantageous embodiment of a self aligned bipolar transistor of the present invention using a sacrificial nitride emitter and a silicon nitride ring. To simplify the drawings the reference numerals from previous drawings will sometimes not be repeated for structures that have already been identified. For purposes of clarity of illustration the thickness of the structures will sometimes not be drawn to scale.

The structure 100 shown in FIG. 1 comprises a Non-Selective Epitaxial Growth (NSEG) collector 110 and a selective implanted collector (SIC) 120 located within a central portion of the NSEG collector 110. The central portion of the NSEG collector 110 is located between two shallow trench isolation (STI) structures 130. As shown in FIG. 1, a layer of Non-Selective Epitaxial Growth (NSEG) base material 140 is placed over the NSEG collector 110 and over the STI structures 130.

Then a layer of a silicon oxide material 150 is placed over the NSEG base 140. In one advantageous embodiment of the invention, the silicon oxide material 150 comprises a layer of oxide (e.g., tetraethyloxysilane) that is approximately twenty nanometers (20 nm) thick. Then a layer of silicon nitride 160 is placed over the silicon oxide material 150 to form a sacrificial nitride emitter and a silicon nitride ring. In one advantageous embodiment of the invention, the layer of silicon nitride 160 is approximately three hundred nanometers (300 nm) thick.

Then a silicon nitride ring 220 and a sacrificial nitride emitter 240 are formed by using a mask and etch procedure to remove portions of the layer of silicon nitride 160. A mask (not shown) is provided that has portions that form a pattern of a sacrificial emitter 240 surrounded by a silicon nitride ring 220. Portions of the silicon nitride 160 that are exposed when the mask is in place are removed by the etch procedure. Portions of the silicon oxide material 150 that are exposed (i.e., not located under the silicon nitride ring 220 or under the sacrificial nitride emitter 240) are also removed by the etch procedure. The resulting structure of silicon nitride ring 220 and the sacrificial nitride emitter 240 and the silicon oxide material 150 are shown in the structure 200 shown in FIG. 2.

Figure 2:
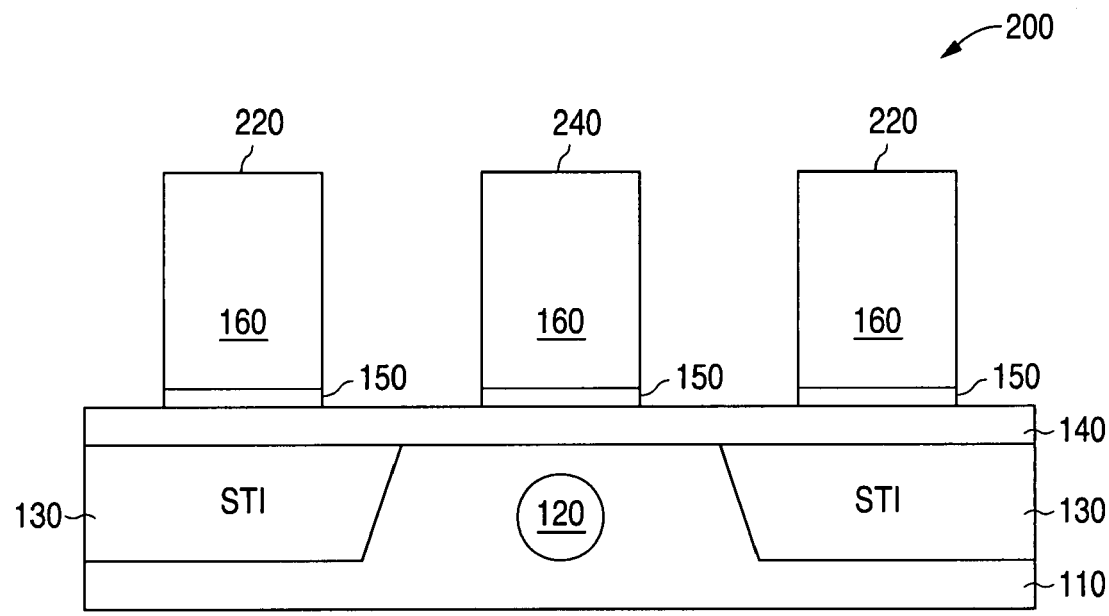
FIG. 2 illustrates a schematic diagram of a cross section of a structure formed during the manufacture of self aligned bipolar transistor using a sacrificial nitride emitter and a silicon nitride ring of the present invention.
Figure 3:
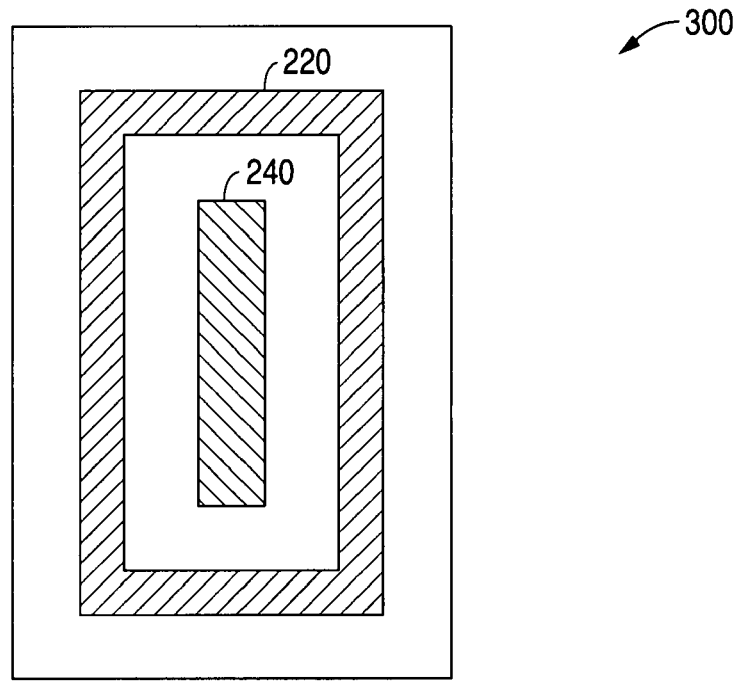
FIG. 3 illustrates a plan view showing a sacrificial emitter of the invention surrounded by a silicon nitride ring of the invention.
Figure 4:
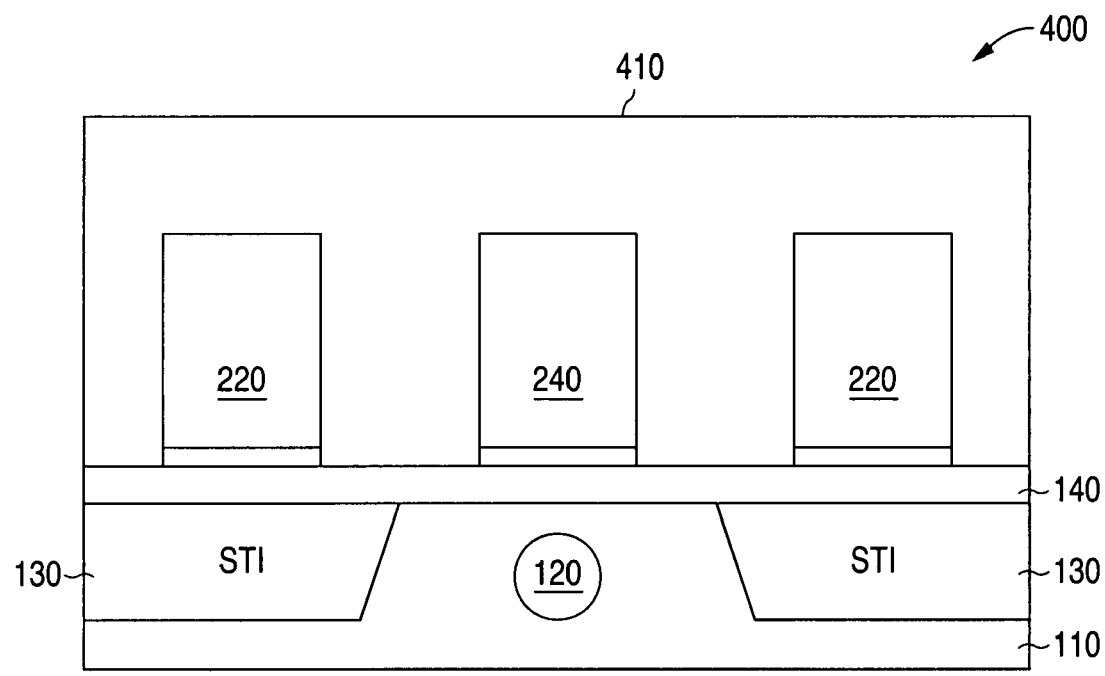
FIGS. 4 through 16 illustrate successive steps in the formation of an advantageous embodiment of a self aligned bipolar transistor of the present invention using a sacrificial emitter and a silicon nitride ring.
Figure 5:
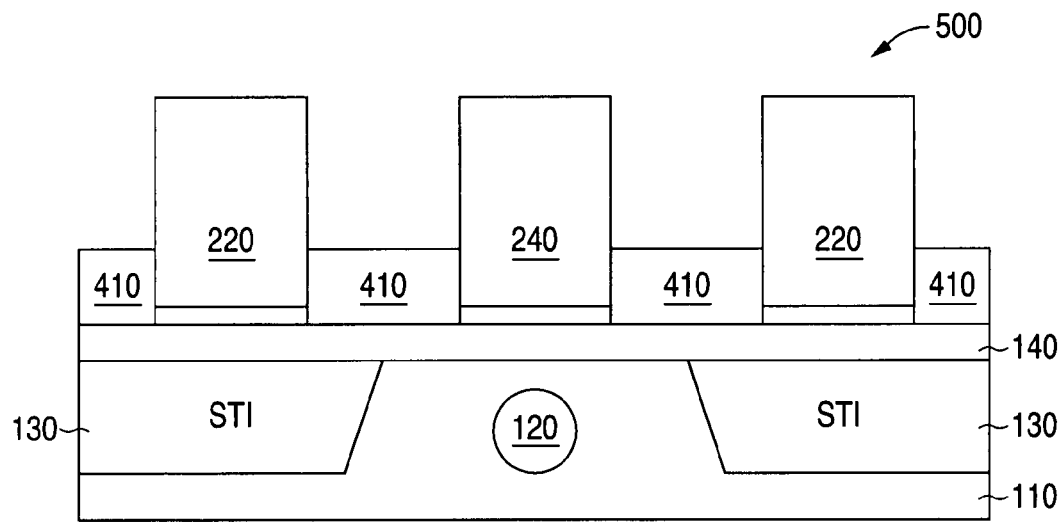
Figure 6:
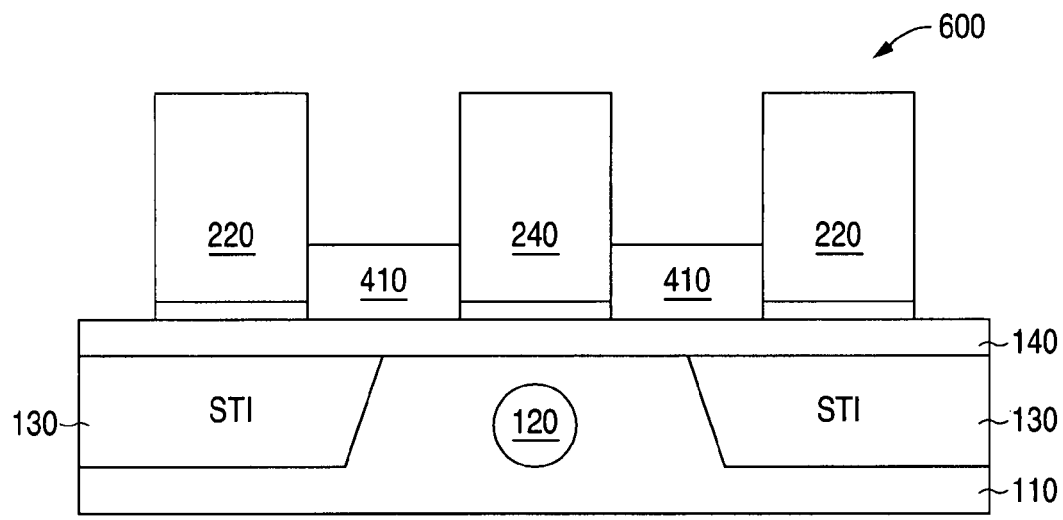
Figure 7:
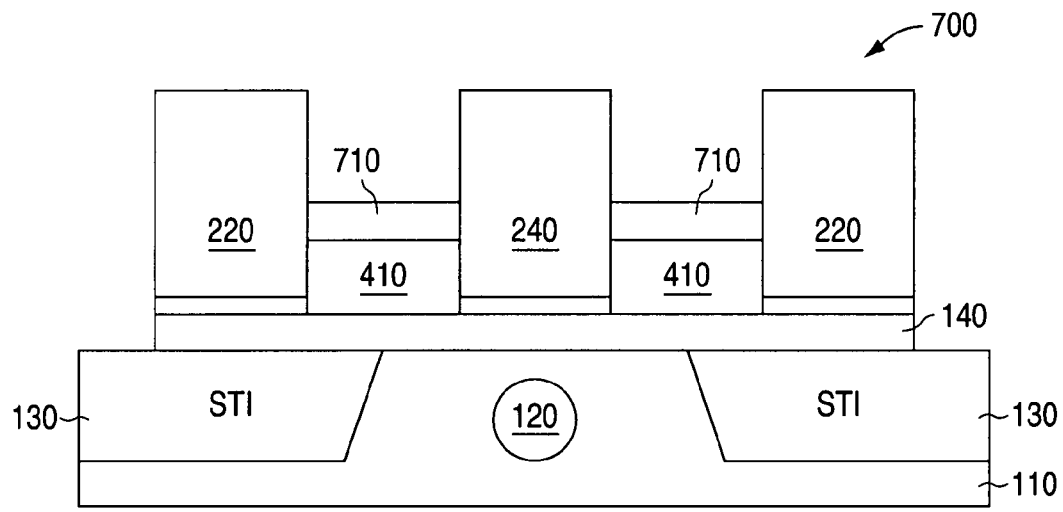
Figure 8:
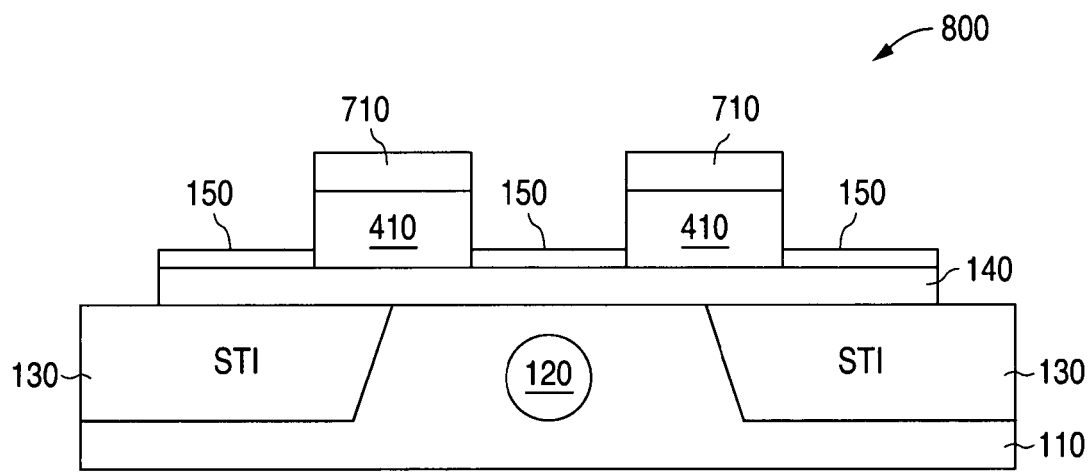
Figure 9:
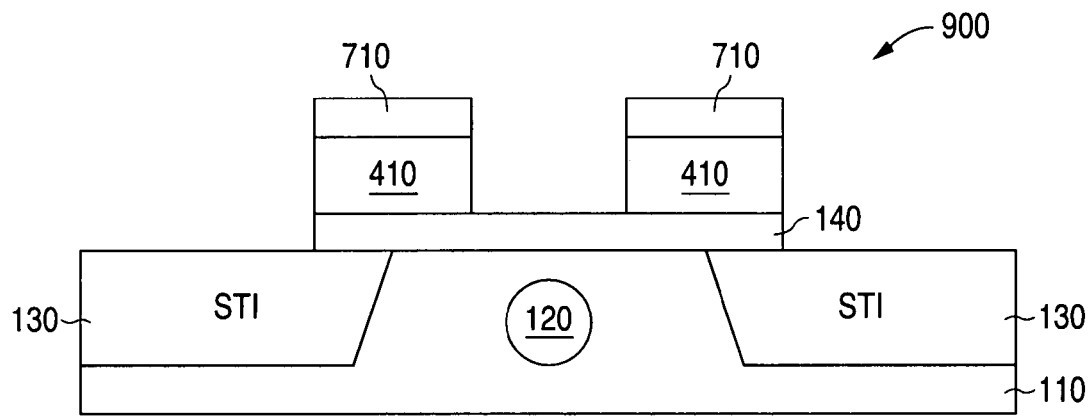
Figure 10:
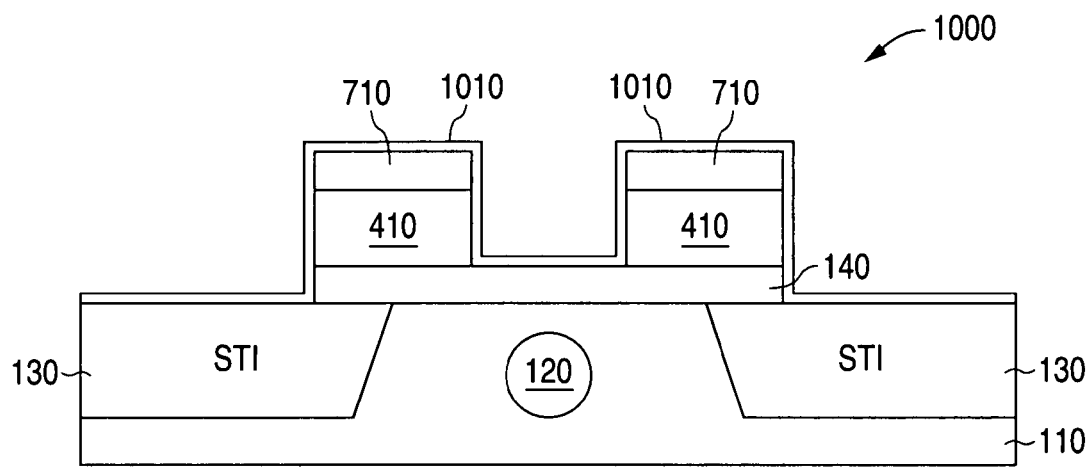
Figure 11:
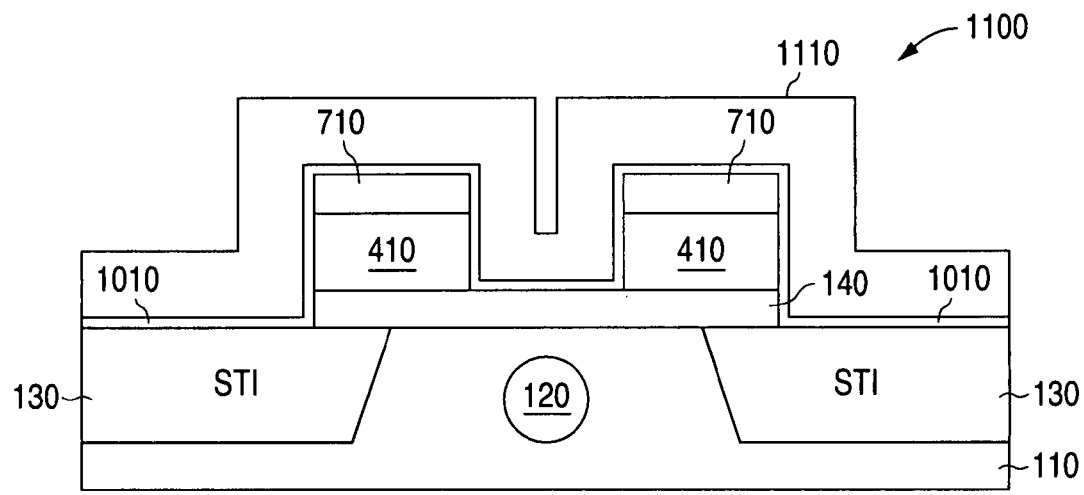

FIG. 2 illustrates a cross sectional view. A plan view 300 showing the spatial relationship between the silicon nitride ring 220 and the sacrificial nitride emitter 240 is shown in FIG. 3. The plan view 300 shows that the sacrificial nitride emitter 240 occupies a central portion located over the active area of the bipolar transistor. The plan view 300 also shows that the silicon nitride ring 220 has a continuous geometry that surrounds the sacrificial nitride emitter 240. In the example shown in FIG. 2 and in FIG. 3 the geometry of the silicon nitride ring 220 is rectangular. It is understood that the geometry of the silicon nitride ring 220 is not limited to a rectangular geometry. The rectangular geometry of the silicon nitride ring 220 that is shown in the figures is simply one example of a geometrical pattern that the silicon nitride ring 220 may have.

In the next step of the method a layer of in-situ doped polysilicon 410 is deposited over the structure 200 that is shown in FIG. 2. The thickness of the doped polysilicon layer 410 that is used is adjustable to optimize the method for appropriate fill properties. The doped polysilicon layer 210 completely covers the sacrificial emitter 240 and the silicon nitride ring 220. The result of depositing the doped polysilicon layer 410 is shown in the structure 400 shown in FIG. 4.

Then an unmasked etch procedure is used to etch away portions of the doped polysilicon layer 410 back to a desired thickness. In one advantageous embodiment of the method the desired thickness for the etched back doped polysilicon layer 410 is approximately one hundred nanometers (100 nm). The result of etching away portions of the doped polysilicon layer 410 is shown in the structure 500 shown in FIG. 5.

Then a protection mask (not shown) is placed over the inner ring area. The protection mask is placed over the top of the silicon nitride ring 220 and over the top of the sacrificial nitride emitter 240 and over the area between the silicon nitride ring 220 and the sacrificial nitride emitter 240. Then an etch procedure is used to etch away portions of the doped polysilicon layer 410 that are outside of the silicon nitride ring 220. The etch procedure also etches away portions of the NSEG base 140 that are located outside of the silicon nitride ring 220. The etch procedure stops on the shallow trench isolation (STI) structures 130. The result of etching away the portions of the doped polysilicon layer 410 and the portions of the NSEG base 140 that are located outside of the silicon nitride ring 220 is shown in the structure 600 shown in FIG. 6.

The silicon nitride ring 220 provides support for the portions of the doped polysilicon layer 410 that are located within the interior of the silicon nitride ring 220. The portions of the doped polysilicon layer 410 that are located between the sacrificial nitride emitter 240 and the silicon nitride ring 220 will form the raised external base of the transistor.

Then the top surface of the doped polysilicon layer 410 is subjected to a thermal oxidation process. In one advantageous embodiment of the method of the invention the thickness of the thermally oxidized doped polysilicon layer 410 is approximately fifty nanometers (50 nm). A low temperature wet oxidation method may be employed to thermally oxidize the doped polysilicon layer 410. The result of thermally oxidizing the top portion of the doped polysilicon layer 410 is shown in the structure 700 shown in FIG. 7. The thermally oxidized portion of the doped polysilicon layer 410 is designated with reference numeral 710.

Then an unmasked hot phosphoric acid ($H_3PO_4$) wet etch process is applied to etch away all portions of the silicon nitride ring 220 and etch away all portions of the sacrificial emitter 240. The wet etch process stops on the silicon oxide material 150. The result of removing the silicon nitride ring 220 and the sacrificial emitter 240 is shown in the structure 800 shown in FIG. 8.

Then a hydrofluoric acid etch procedure is applied to remove the silicon oxide material 150. The etch procedure also causes a small loss of the thermal oxide material 700. In one advantageous embodiment of the method of the invention, the loss of thermal oxide material 710 is approximately five nanometers (5 nm). Then a mask and dry etch procedure is applied to remove the portions of the NSEG base material 140 that are located outside of the doped polysilicon layer 410 (and thermally oxidized portion 710 of the doped polysilicon layer 410). The result of removing the silicon oxide material 150 and the portions of the NSEG base material 140 is shown in the structure 900 shown in FIG. 9.

Then an oxide layer 1010 (e.g., tetraethyloxysilane) is deposited over the structure 900. In one advantageous embodiment the thickness of the oxide layer 1010 is approximately twenty nanometers (20 nm). The result of depositing the oxide layer 1010 is shown in the structure 1000 shown in FIG. 10.

Then a layer 1110 of amorphous silicon (a-silicon) is deposited over the oxide layer 1010. In one advantageous embodiment the thickness of the amorphous silicon layer 1110 is approximately one hundred nanometers (100 nm). The result of the deposition of the amorphous silicon layer 1110 is shown in the structure 1100 shown in FIG. 11.

Figure 12:
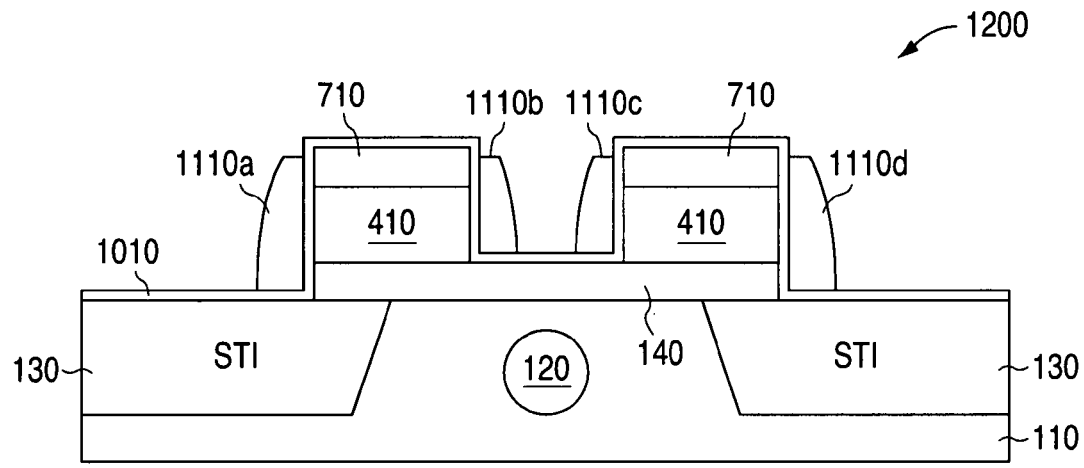
Figure 13:
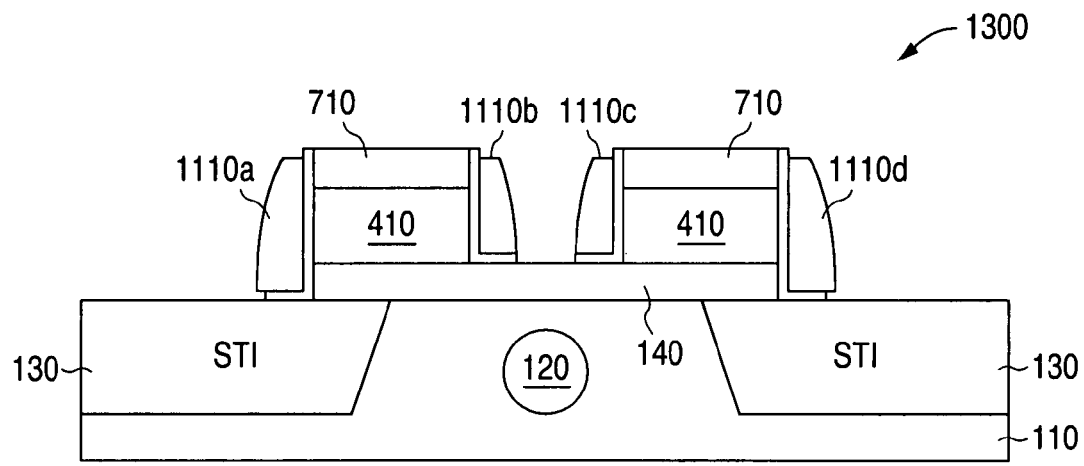
Figure 14:
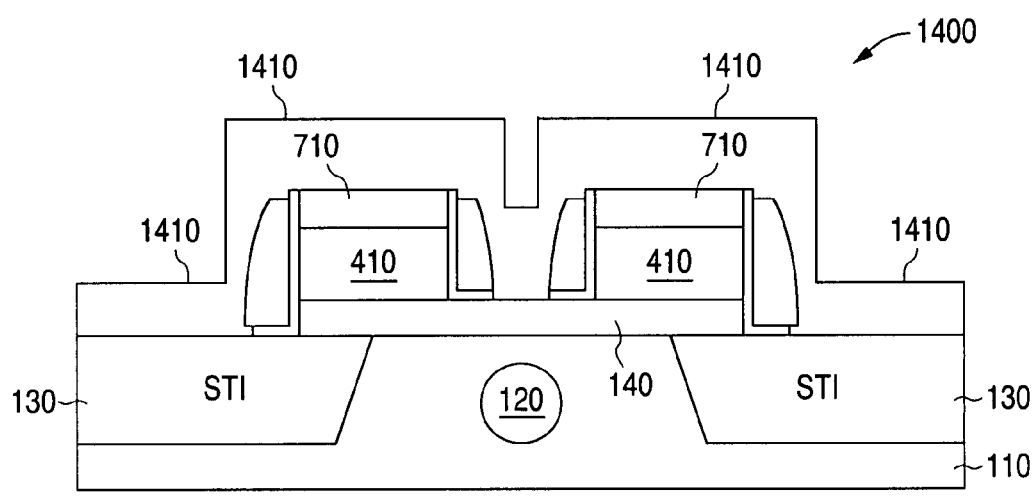
Figure 15:
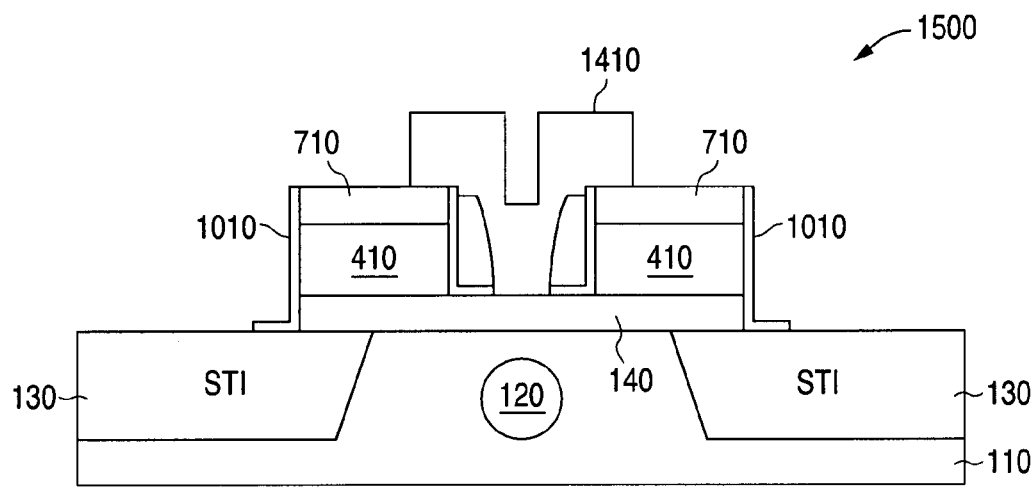

Then an unmasked dry etch procedure is performed to etch the amorphous silicon layer 1110 to form amorphous silicon spacers from portions of the amorphous silicon layer 1110. The result of the dry etch procedure is shown in the structure 1200 shown in FIG. 12. The four amorphous silicon spacers that are shown in FIG. 12 are designated with reference numerals 1110a, 1110b, 1110c and 1110d.

Then an unmasked hydrofluoric acid (HF) etch process is applied to etch away certain portions of the oxide layer 1010. The etch process is applied to remove portions of the oxide layer 1010 in the emitter window to expose the underlying NSEG base material 140. The etch process is also applied to remove portions of the oxide layer 1010 from the top of the thermally oxidized portion 710 of the doped polysilicon layer 410. The etch process is also applied to remove a small portion of the thermal oxide material 710. In one advantageous embodiment of the method of the invention, the thickness of the thermal oxide material 710 that is removed is at most five nanometers (5 nm). The etch process is also applied to remove lateral portions of the oxide layer 1010 that cover the shallow trench isolation (STI) structures 130. The result of applying the etch process to remove the portions of the oxide layer 1010 is shown in the structure 1300 shown in FIG. 13. There may be a small amount of oxide layer 1010 that is removed from under the outer edge of the silicon spacers 1110a, 1110b, 1110c and 1110d.

Then an in-situ doped polysilicon layer 1410 is deposited over the structure 1300. In one advantageous embodiment of the invention the thickness of the doped polysilicon layer 1410 is approximately one hundred nanometers (100 nm). The result of depositing the doped polysilicon layer 1410 is shown in the structure 1400 shown in FIG. 14.

A first polyemitter etch procedure is then performed. A polyemitter mask (not shown) is applied to cover the central portions of the structure 1400. The first polyemitter etch procedure removes portions of the doped polysilicon layer 1410 that are not located under the polyemitter mask. The first polyemitter etch procedure also removes the silicon spacer 1110a and the silicon spacer 1110d. The first polyemitter etch procedure stops on the thermally oxidized portion 710 of the doped polysilicon layer 410 and on the shallow trench isolation (STI) structures 130. The result of applying the first polyemitter etch procedure is shown in the structure 1500 shown in FIG. 15.

Figure 16:
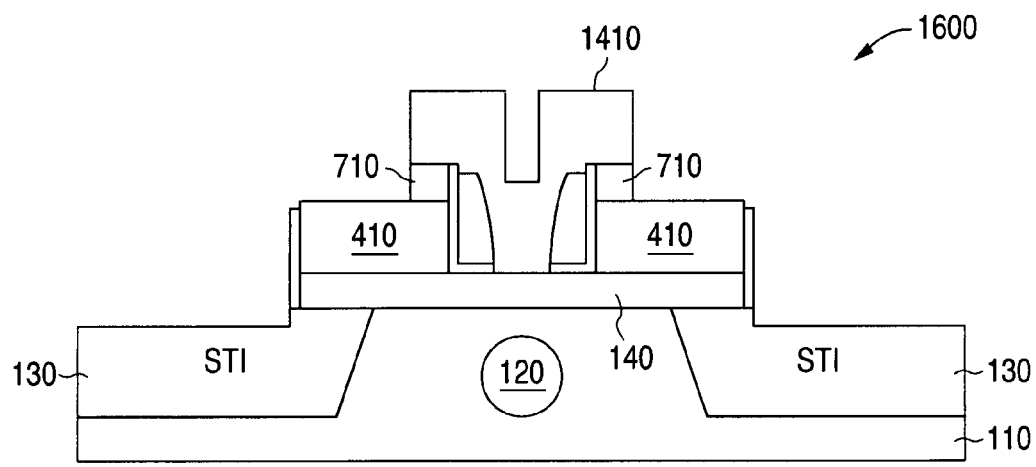

A second polyemitter etch procedure is then performed. The same polyemitter mask (not shown) that was used in the first polyemitter etch procedure is used. The second polyemitter etch procedure removes lateral portions of oxide layer 1010 that are not located under the polyemitter mask. As shown in FIG. 16, the second polyemitter etch procedure also removes the thermally oxidized portion 710 down to the doped polysilicon layer 410. The second polyemitter etch procedure also removes a portion of the top surface of the shallow trench isolation (STI) structures 130. The result of applying the second polyemitter etch procedure is shown in the structure 1600 shown in FIG. 16.

The structure 1600 shown in FIG. 16 represents a self aligned architecture for a bipolar transistor that has been manufactured by using a sacrificial nitride emitter and a silicon nitride ring without using costly and time consuming complex process steps (e.g., Chemical Mechanical Polishing (CMP), selective epitaxial growth). The present invention provides an efficient method for creating a raised external base without using selective epitaxial (EPI) growth. The raised external base is formed simultaneously with the self aligned emitter-base structure. The method of the present invention significantly reduces process complexity and improves the compatibility of self aligned bipolar transistor architecture with BiCMOS technology.

Figure 17:
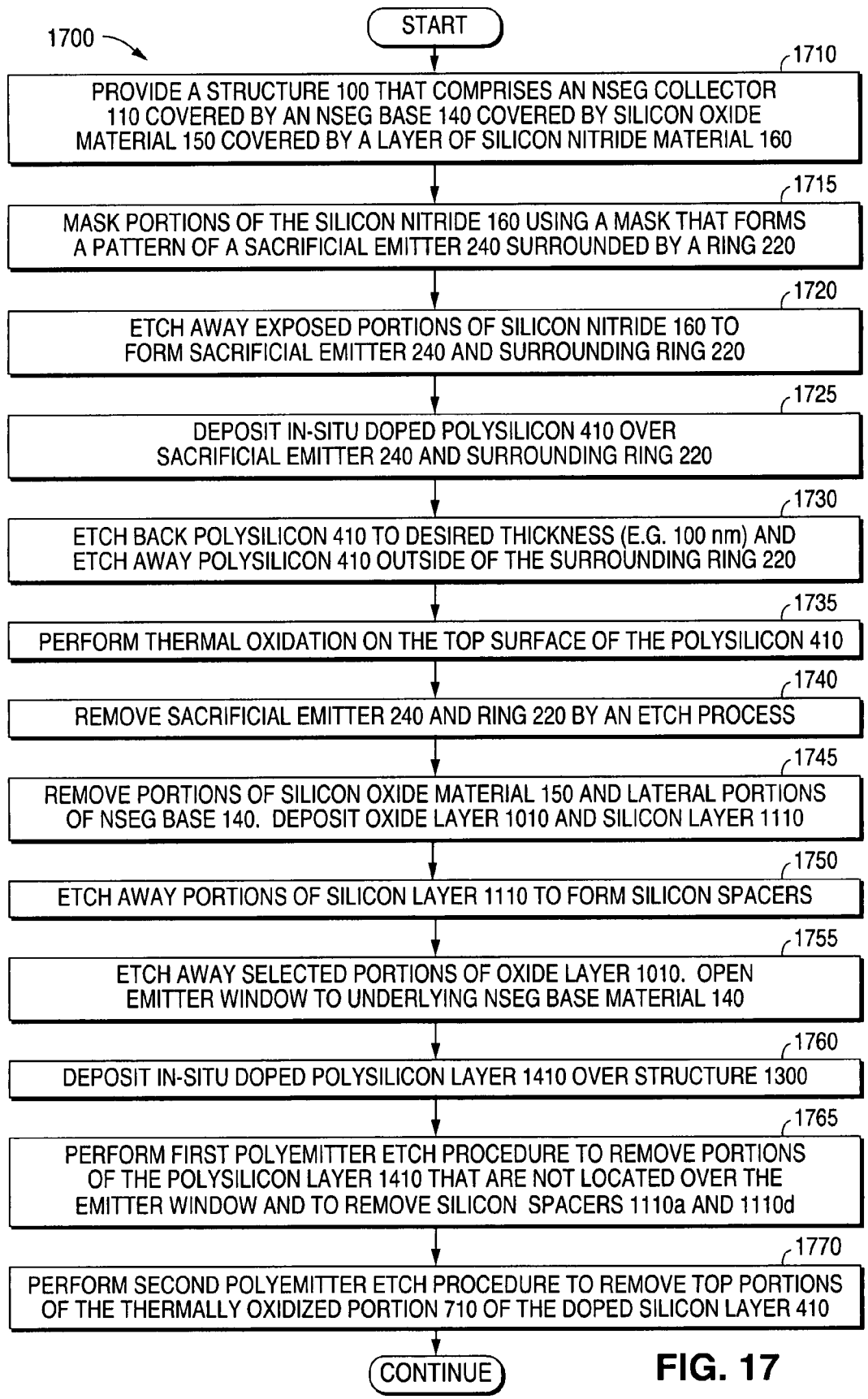
FIG. 17 illustrates a flow chart showing the steps of an advantageous embodiment of a method of the present invention.

FIG. 17 illustrates a flow chart 1700 showing the steps of an advantageous embodiment of a method of the present invention. In the first step of the method a structure 100 is provided that comprises an NSEG collector 110 covered by an NSEG base 140 covered by silicon oxide material 150 covered by a layer of silicon nitride material 160 (step 1710). Then a mask is provided that forms a pattern of a sacrificial emitter 240 surrounded by a ring 220 and the silicon nitride material 160 is covered with the mask (step 1715).

Then the exposed portions of the silicon nitride material 160 are etched away to form the sacrificial emitter 240 and the surrounding ring 220 (step 1720). Then a layer of in-situ doped polysilicon 410 is deposited over the sacrificial emitter 240 and the surrounding ring 220 (step 1725). Then the doped polysilicon layer 410 is etched back to a desired thickness (e.g., 100 nm) and the portions of the doped polysilicon layer 410 that are located outside the surrounding ring 220 are etched away (step 1730).

Then a thermal oxidation process is performed on the top surface of the doped polysilicon layer 410 to form a thermally oxidized portion 710 (step 1735). Then an etch process is performed to remove the sacrificial emitter 240 and the surrounding ring 220 (step 1740). Then the exposed portions of the silicon oxide material 150 and the lateral portions of the NSEG base material 140 are removed. An oxide layer 1010 and a silicon layer 1110 are then deposited (step 1745).

Then portions of the silicon layer 1110 are etched away to form the silicon spacers 1110a, 1110b, 1110c and 1110d (step 1750). Then selected portions of the oxide layer 1010 are etched away and the emitter window is opened to the underlying NSEG base material 140 (step 1755). Then an in-situ doped polysilicon layer 1410 is deposited over the resulting structure 1300 (step 1760).

Then a first polyemitter etch procedure is performed to remove portions of the polysilicon layer 1410 that are not located over the emitter window and to remove the silicon spacer 1110a and the silicon spacer 1110d (step 1765). Then a second polyemitter etch procedure is performed to remove top portions of the thermally oxidized portion 710 of the doped silicon layer 410 (step 1770).

The system and method of the present invention provides several significant advantages. The present invention removes the need to perform a Chemical Mechanical Polishing (CMP) procedure to planarize the topology of the sacrificial emitter. This solves the prior art problem of compatibility with BiCMOS technology.

The system and method of the invention provides a simple process that provides a non-selective growth EPI base, no CMP procedure for the sacrificial emitter, and no external base implant. The system and method of the present invention provides an efficient self aligned emitter-base structure that has low levels of parasitic capacitances and parasitic resistances. The system and method of the present invention also provides a high level of radio frequency (RF) performance.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method of manufacturing a self aligned bipolar transistor comprising the steps of:
    forming an active region of the transistor, the active region comprising a non-selective epitaxial growth (NSEG) collector and a selective implanted collector (SIC) located within a central portion of the NSEG collector;
    forming a silicon nitride sacrificial emitter above the active region of the transistor and above the SIC collector; and
    forming a silicon nitride ring that surrounds and does not contact the silicon nitride emitter.

2. The method as claimed in claim 1 further comprising the step of forming a raised external base for the transistor.

3. The method as claimed in claim 1 wherein the silicon nitride sacrificial emitter and the silicon nitride ring around the silicon nitride emitter are formed by:
    depositing a layer of silicon nitride material over the active region of the transistor; and
    performing a first etch process to simultaneously form the silicon nitride sacrificial emitter and the silicon nitride ring.

4. The method as claimed in claim 1 wherein the silicon nitride ring has a rectangular geometry.

5. The method as claimed in claim 3 further comprising the steps of:
    depositing a layer of doped polysilicon over the silicon nitride sacrificial emitter and over the silicon nitride ring, the doped polysilicon layer contacting sides of the silicon nitride sacrificial emitter and sides of the silicon nitride ring; and performing a second etch process to remove the sacrificial silicon nitride emitter and the silicon nitride ring.

6. The method as claimed in claim 5 further comprising the steps of:
performing a third etch process to open an emitter window to the active region of the transistor; and
forming an emitter structure in the emitter window of the active region of the transistor.

7. A method of manufacturing a self aligned bipolar transistor comprising the steps of:
forming an active region of the transistor that comprises a collector portion covered by a base portion covered by a silicon oxide material, the collector portion comprising a non-selective epitaxial growth (NSEG) collector and a selective implanted collector (SIC) located within a central portion of the NSEG collector;
forming a silicon nitride sacrificial emitter on the silicon oxide material above the active region of the transistor and above the SIC collector; and
forming a silicon nitride ring on the silicon oxide material wherein the silicon nitride ring surrounds the silicon nitride sacrificial emitter.

8. The method as claimed in claim 7 wherein the silicon nitride sacrificial emitter and the silicon nitride ring around the silicon nitride sacrificial emitter are formed by:
depositing a layer of silicon nitride material over the silicon oxide material; and
performing a first etch process to simultaneously form the silicon nitride sacrificial emitter and the silicon nitride ring.

9. The method as claimed in claim 8 further comprising the steps of:
removing portions of the silicon oxide material to expose base portions of the transistor that are not under the silicon nitride sacrificial emitter or under the silicon nitride ring; and
depositing a layer of doped polysilicon over the silicon nitride sacrificial emitter and over the silicon nitride ring and over the exposed base portions of the transistor.

10. The method as claimed in claim 9 further comprising the steps of:
performing a second etch process to remove portions of the layer of doped polysilicon to reduce the thickness of the layer of doped polysilicon to a desired thickness; and
thermally oxidizing the layer of doped polysilicon.

11. The method as claimed in claim 10 further comprising the step of performing a third etch process to remove the silicon nitride sacrificial emitter and remove the silicon nitride ring.

12. The method as claimed in claim 7 wherein the silicon nitride ring that surrounds the silicon nitride sacrificial emitter has a rectangular geometry.

13. The method as claimed in claim 11 further comprising the steps of:
performing a fourth etch process to remove the silicon oxide material that is exposed after the silicon nitride sacrificial emitter and the silicon nitride ring have been removed;
performing a fifth etch process to open an emitter window to the base portion of the transistor in the active area of the transistor; and
forming an emitter structure in the emitter window.

14. A method of manufacturing a raised external base in a self aligned bipolar transistor comprising the steps of:
forming an active region of the transistor that comprises a collector portion covered by a base portion covered by a silicon oxide material, the collector portion comprising a non-selective epitaxial growth (NSEG) collector and a selective implanted collector (SIC) located within a central portion of the NSEG collector;
forming a silicon nitride sacrificial emitter on the silicon oxide material above the active region of the transistor and above the SIC collector;
forming a silicon nitride ring on the silicon oxide material wherein the silicon nitride ring surrounds and does not contact the silicon nitride sacrificial emitter; and
forming the raised external base with support of the silicon nitride ring.

15. The method as claimed in claim 14 wherein the silicon nitride sacrificial emitter and the silicon nitride ring around the silicon nitride sacrificial emitter are formed by:
depositing a layer of silicon nitride material over the silicon oxide material; and
performing a first etch process to simultaneously form the silicon nitride sacrificial emitter and the silicon nitride ring.

16. The method as claimed in claim 15 further comprising the steps of:
removing portions of the silicon oxide material to expose base portions of the transistor that are not under the silicon nitride sacrificial emitter or under the silicon nitride ring; and
depositing a layer of doped polysilicon over the silicon nitride sacrificial emitter and over the silicon nitride ring and over the exposed base portions of the transistor.

17. The method as claimed in claim 16 further comprising the steps of:
performing a second etch process to remove portions of the layer of doped polysilicon to reduce the thickness of the layer of doped polysilicon to a desired thickness; and
thermally oxidizing the layer of doped polysilicon.

18. The method as claimed in claim 17 further comprising the step of performing a third etch process to remove the silicon nitride sacrificial emitter and remove the silicon nitride ring.

19. The method as claimed in claim 14 wherein the silicon nitride ring that surrounds the silicon nitride sacrificial emitter has a rectangular geometry.

20. The method as claimed in claim 18 further comprising the steps of:
performing a fourth etch process to remove the silicon oxide material that is exposed after the silicon nitride sacrificial emitter and the silicon nitride ring have been removed;
performing a fifth etch process to open an emitter window to the base portion of the transistor in the active area of the transistor; and
forming an emitter structure in the emitter window.

21. The method as claimed in claim 5 further comprising the steps of:
depositing a layer of tetraethyloxysilane over the doped polysilicon layer, the tetraethyloxysilane layer contacting sides of the doped polysilicon layer; and
forming silicon spacers adjacent the sides of the doped polysilicon layer, wherein the tetraethyloxysilane layer is between each silicon spacer and its respective side of the doped polysilicon layer.

* * * * *